(12) United States Patent
Tegenbosch et al.

(10) Patent No.: US 9,335,641 B2
(45) Date of Patent: May 10, 2016

(54) OPTICAL ELEMENT MOUNT FOR LITHOGRAPHIC APPARATUS

(75) Inventors: Henricus Gerardus Tegenbosch, Eindhoven (NL); Alexander Matthijs Struycken, Eindhoven (NL); Jacob Kleijn, Wintelre (NL); Ruud Antonius Catharina Maria Beerens, Roggel (NL); Ivo Vanderhallen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 925 days.

(21) Appl. No.: 13/054,869

(22) PCT Filed: Jul. 16, 2009

(86) PCT No.: PCT/EP2009/059131
§ 371 (c)(1),
(2), (4) Date: May 10, 2011

(87) PCT Pub. No.: WO2010/010034
PCT Pub. Date: Jan. 28, 2010

(65) Prior Publication Data
US 2011/0205517 A1    Aug. 25, 2011

Related U.S. Application Data

(60) Provisional application No. 61/129,813, filed on Jul. 21, 2008.

(51) Int. Cl.
*G03B 27/42* (2006.01)
*G03F 7/20* (2006.01)

(52) U.S. Cl.
CPC ........ *G03F 7/70891* (2013.01); *G03F 7/70175* (2013.01); *G03F 7/70783* (2013.01); *G03F 7/70825* (2013.01)

(58) Field of Classification Search
CPC .... G11B 7/0932; H04N 5/2254; G02B 7/021; G02B 13/143; G02B 7/02; G02B 7/023; G02B 7/022; G02B 7/10; G02B 3/00; G02B 7/003; G02B 7/08; G02B 7/026; G02B 7/028; G02B 13/002; G02B 13/003; G02B 13/0045; G02B 27/646; G02B 27/017; G03F 7/70825; G03F 7/70783; G03B 27/54
USPC .......................... 355/53, 63, 67, 77; 359/871
See application file for complete search history.

(56) References Cited

U.S. PATENT DOCUMENTS 6,239,924 B1 * 5/2001 Watson et al. ................ 359/819
6,392,825 B1   5/2002 Trunz et al.
(Continued)

FOREIGN PATENT DOCUMENTS

EP    1 736 830    12/2006
JP    2000-227533    8/2000
(Continued)

OTHER PUBLICATIONS

Chinese Office Action dated Sep. 18, 2012 in corresponding Chinese Patent Application No. 200980127911.8.
(Continued)

*Primary Examiner* — Mesfin T Asfaw
(74) *Attorney, Agent, or Firm* — Pillsbury Winthrop Shaw Pittman LLP

(57) ABSTRACT

A mount configured to mount an optical element in a module for a lithographic apparatus. The mount includes a plurality of resilient members constructed and arranged to circumferentially support the optical element. Each resilient member includes a plurality of resilient subsections that are configured to engage the optical element around a perimeter thereof. Each resilient subsection is configured to flex independent of another resilient subsection.

12 Claims, 4 Drawing Sheets

(56) References Cited

U.S. PATENT DOCUMENTS

| | | |
|---|---|---|
| 6,825,998 B2 | 11/2004 | Yoshida |
| 2003/0234918 A1* | 12/2003 | Watson ............................ 355/53 |
| 2004/0130809 A1* | 7/2004 | Antoni et al. ................. 359/846 |
| 2004/0150806 A1* | 8/2004 | Brunotte et al. ................ 355/67 |
| 2004/0169940 A1 | 9/2004 | Yoshida |
| 2004/0227103 A1 | 11/2004 | Singer et al. |
| 2005/0248860 A1 | 11/2005 | Soemers et al. |

FOREIGN PATENT DOCUMENTS

| | | |
|---|---|---|
| JP | 2004-258273 | 9/2004 |
| JP | 2005-109502 | 4/2005 |

OTHER PUBLICATIONS

Japanese Office Action mailed Mar. 19, 2013 in corresponding Japanese Patent Application No. 2011-519128.

International Search Report as issued for PCT/EP2009/059131, dated Nov. 23, 2009.

Japanese Office Action mailed Dec. 24, 2014 in corresponding Japanese Patent Application No. 2011-519128.

Korean Office Action mailed Nov. 13, 2015 in corresponding Korean Patent Application No. 10-2010-7028987.

* cited by examiner

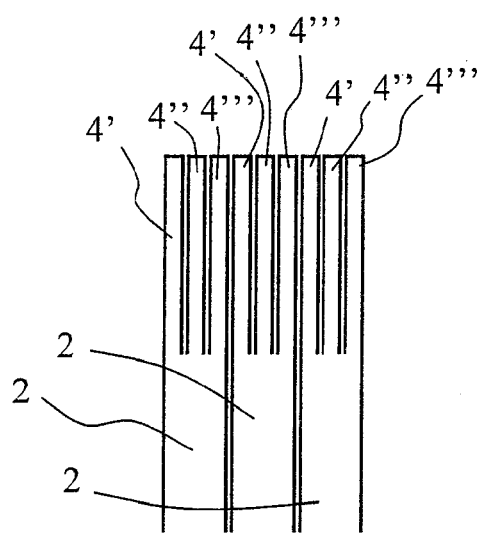
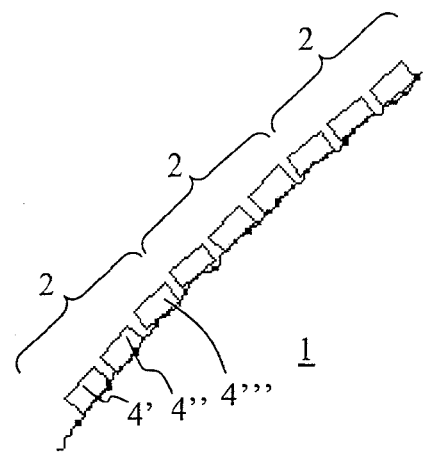
Figure 5
Figure 6

OPTICAL ELEMENT MOUNT FOR LITHOGRAPHIC APPARATUS

CROSS-REFERENCE TO RELATED APPLICATIONS

This application is the National Phase entry of PCT/EP2009/059131, filed on Jul. 16, 2009, which claims the benefit of U.S. provisional application 61/129,813, filed on Jul. 21, 2008, the contents of both of which are incorporated herein in their entireties by reference.

FIELD

The present invention relates to an optical element mount for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Along with useful EUV in-band radiation, EUV radiation sources may produce almost equal (and sometimes more) undesirable out-of-band infrared ("IR") and deep ultraviolet ("DUV") radiation.

Optical elements that are used in lithographic apparatus may heat up (accidentally or deliberately) to temperatures up to 500° C. The allowed deformation of the optical element may be limited, which may also limit imposed loads and/or stresses, such as Hertzian stresses, on the optical element. The optical element is typically suspended and desirable has relatively high natural frequencies with respect to the mass of the optical element. The optical element should be mounted in a way that allows the optical element to withstand relatively high acceleration levels.

SUMMARY

It is desirable to provide a mount that has improved accuracy, reproducibility, and decreased sensitivity for irregularities from the nominal geometry of the optical element that the mount supports.

According to an embodiment of the present invention, there is provided a mount that is configured to mount an optical element in a module for a lithographic apparatus. The mount includes a plurality of resilient members constructed and arranged to circumferentially support the optical element. Each resilient member includes a plurality of resilient subsections that are configured to engage the optical element around a perimeter thereof. Each resilient subsection is configured to flex independent of another resilient subsection. Optionally, the optical element may comprise a lens or a mirror.

According to an embodiment of the present invention, there is provided a module for a lithographic apparatus. The module includes a radiation source constructed and arranged to generate extreme ultraviolet radiation, a collector constructed and arranged to condition the extreme ultraviolet radiation, and a mount configured to mount an optical element in the collector. The mount includes a plurality of resilient members constructed and arranged to circumferentially support the optical element. Each resilient member includes a plurality of resilient subsections that are configured to engage the optical element around a perimeter thereof. Each resilient subsection is configured to flex independent of another resilient subsection. Optionally, the optical element may comprise a lens or a mirror.

According to an embodiment of the present invention, there is provided a resilient member constructed and arranged to exert a force on an optical element of a module of a lithographic apparatus. The resilient member includes a plurality of resilient subsections that are configured to flex independent of another resilient subsection. Optionally, the optical element may comprise a lens or a mirror.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5 depicts a mount for an optical element according to an embodiment of the invention; and FIG. 6 depicts the mount of FIG. 5 with an optical element.

DETAILED DESCRIPTION

Figure 1:
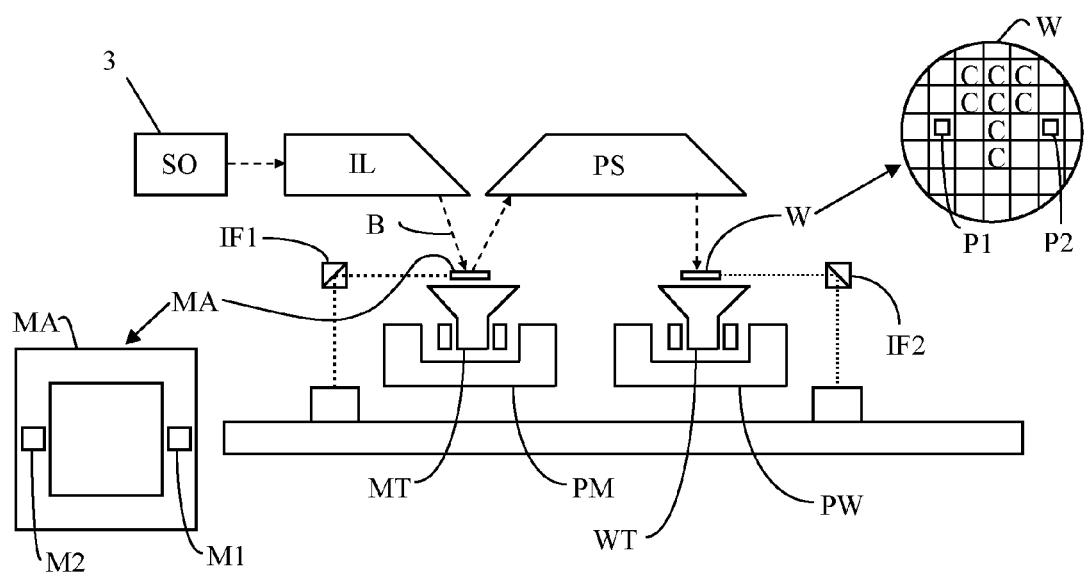
FIG. 1 depicts a lithographic apparatus in accordance with an embodiment of the invention.

FIG. 1 schematically depicts an embodiment of a lithographic apparatus, that can be or include an embodiment of the invention. The apparatus includes an illumination system (illuminator) IL configured to condition a radiation beam B (e.g. EUV radiation); a support structure or patterning device support (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO may be part of a radiation system 3 (i.e. radiation generating unit 3). The radiation system 3 and the lithographic apparatus may be separate entities. In such cases, the radiation system 3 is not considered to form part of the lithographic apparatus and the radiation beam is passed from the source SO of radiation system 3 to the illuminator IL with the aid of a beam delivery system including, for example, suitable directing mirrors and/or a beam expander. In other cases, the source may be an integral part of the lithographic apparatus The source SO of the radiation system 3 may be configured in various ways. For example, the source SO may be a laser produced plasma source (LPP source), for example a Tin LPP source (such LPP sources are known per se) or a discharge-produced plasma source (DPP source). The source SO may also be a different type of radiation source.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
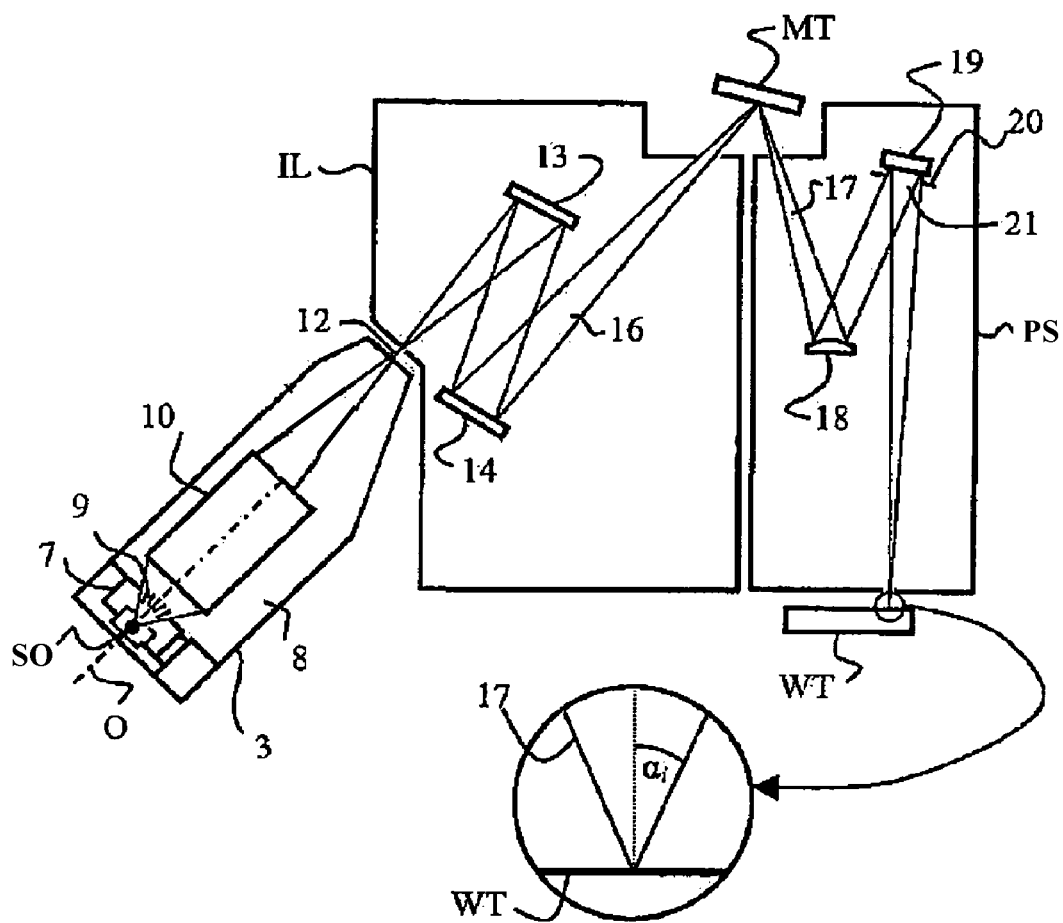
FIG. 2 depicts a lithographic apparatus in accordance with an embodiment of the invention.

FIG. 2 schematically shows a further embodiment of an EUV lithographic apparatus, having a principle of operation that is similar to the operation of the apparatus shown in the embodiment of FIG. 1. In the embodiment of FIG. 2, the apparatus includes a source-collector-module or radiation unit 3 (also referred to herein as a radiation system), an illumination system IL and a projection system PS. According to an embodiment, radiation unit 3 is provided with a radiation source SO, preferably a laser produced plasma ("LPP") source. In the present embodiment, the radiation emitted by radiation source SO may be passed from the source chamber 7 into a chamber 8 via a gas barrier or "foil trap" 9. In FIG. 2, the chamber 8 includes a radiation collector 10.

FIG. 2 depicts the application of a grazing incidence collector 10. However, the collector may be a normal incidence collector, particularly in the case the source is a LPP source. In yet another embodiment, the collector may a Schwarzschild collector (see FIG. 4), and the source may be a DPP source.

The radiation may be focused in a virtual source point 12 (i.e. an intermediate focus IF) from an aperture in the chamber 8. From chamber 8, the radiation beam 16 is reflected in illumination system IL via normal incidence reflectors 13,14 onto a patterning device (e.g. reticle or mask) positioned on support structure or patterning device support (e.g. reticle or mask table) MT. A patterned beam 17 is formed which is imaged by projection system PS via reflective elements 18,19 onto wafer stage or substrate table WT. More elements than shown may generally be present in the illumination system IL and projection system PS.

One of the reflective elements 19 may have in front of it a numerical aperture (NA) disc 20 having an aperture 21 therethrough. The size of the aperture 21 determines the angle $\alpha_i$ subtended by the patterned radiation beam 17 as it strikes the substrate table WT.

In other embodiments, the radiation collector is one or more of a collector configured to focus collected radiation into the radiation beam emission aperture; a collector having a first focal point that coincides with the source and a second focal point that coincides with the radiation beam emission aperture; a normal incidence collector; a collector having a single substantially ellipsoid radiation collecting surface section; and a Schwarzschild collector having two radiation collecting surfaces.

Also, in another embodiment, the radiation source SO may be a laser produced plasma (LPP) source including a light source that is configured to focus a beam of coherent light, of a predetermined wavelength, onto a fuel.

Figure 3:
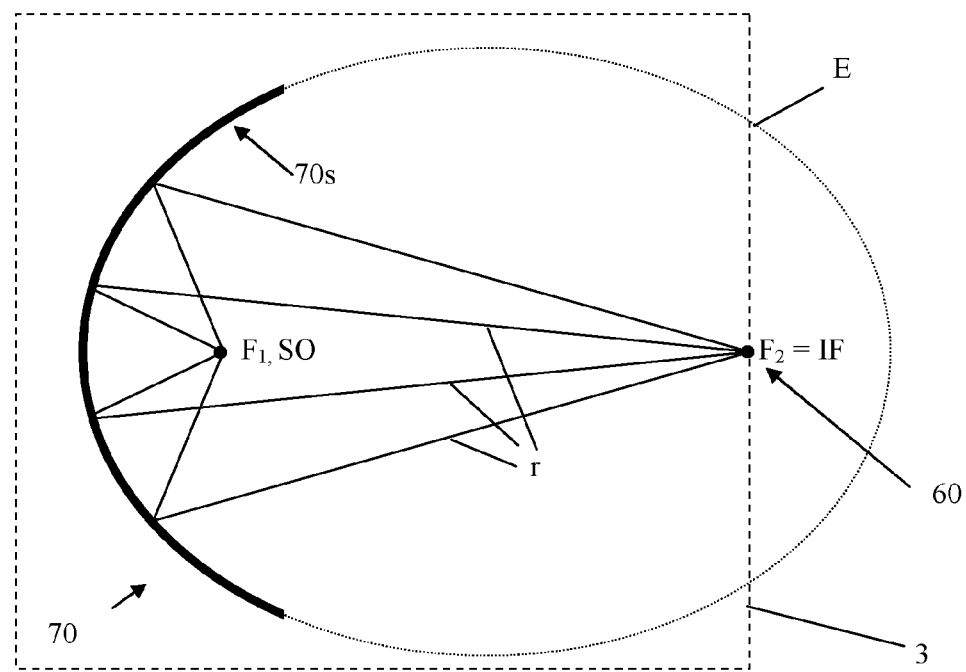
FIG. 3 depicts a radiation source and a normal incidence collector in accordance with an embodiment of the invention.

For example, FIG. 3 shows an embodiment of a radiation source unit 3, in cross-section, including a normal incidence collector 70. The collector 70 has an elliptical configuration, having two natural ellipse focus points F1, F2. Particularly, the normal incidence collector includes a collector having a single radiation collecting surface 70s having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 70 is ellipsoidal (i.e., including a reflection surface 70s that extends along an ellipsoid), it focuses radiation from one focal point F1 into another focal point F2. The focal points are located on the long axis of the ellipsoid at a distance $f=(a2-b2)1/2$ from the center of the ellipse, where 2a and 2b are the lengths of the major and minor axes, respectively. In case that the embodiment shown in FIG. 1 includes an LPP radiation source SO, the collector may be a single ellipsoidal mirror as shown in FIG. 3, where the light source SO is positioned in one focal point (F1) and an intermediate focus IF is established in the other focal point (F2) of the mirror. Radiation emanating from the radiation source, located in the first focal point (F1) towards the reflecting surface 70s and the reflected radiation, reflected by that surface towards the second focus point F2, is depicted by lines r in the drawing. For example, according to an embodiment, a mentioned intermediate focus IF may be located between the collector and an illumination system IL (see FIGS. 1, 2) of a lithographic apparatus, or be located in the illumination system IL, if desired.

Figure 4:
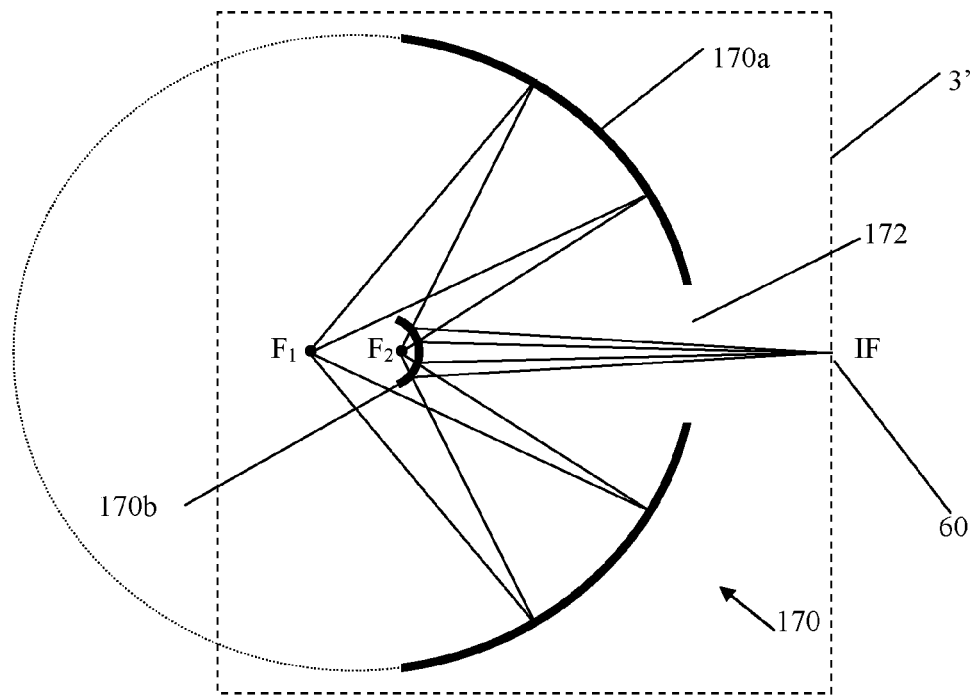
FIG. 4 depicts a radiation source and a Schwarzschild type normal incidence collector in accordance with an embodiment of the invention.

FIG. 4 schematically shows a radiation source unit 3' in accordance with an embodiment of the invention, in cross-section, including a collector 170. In this case, the collector includes two normal incidence collector parts 170a, 170b, each part 170a, 170b preferably (but not necessarily) having a substantially ellipsoid radiation collecting surface section. Particularly, the embodiment of FIG. 4 includes a Schwarzschild collector design, preferably consisting of two mirrors 170a, 170b. The source SO may be located in a first focal point F1. For example, the first collector mirror part 170a may have a concave reflecting surface (for example of ellipsoid or parabolic shape) that is configured to focus radiation emanating from the first focal point F1 towards the second collector mirror part 170b, particularly towards a second focus point F2. The second mirror part 170b may be configured to focus the radiation that is directed by the first mirror part 170a towards the second focus point F2, towards a further focus point IF (for example an intermediate focus). The first mirror part 170a includes an aperture 172 via which the radiation (reflected by the second mirror 170b) may be transmitted towards the further focus point IF. For example, the embodiment of FIG. 4 may beneficially be used in combination with a DPP radiation source.

The source SO may be a LPP source, that is associated with a laser source configured to generate a laser beam of coherent light, having a predetermined wavelength. The laser light is focused onto a fuel (the fuel for example being supplied by a fuel supplier, and for example including fuel droplets) to generate radiation there-from, in a laser produced plasma process. The resulting radiation may be EUV radiation, in this embodiment. In a non-limiting embodiment, the predetermined wavelength of the laser light is 10.6 microns (i.e. μm). For example, the fuel may be tin (Sn), or a different type of fuel, as will be appreciated by the skilled person.

The radiation collector 70 may be configured to collect radiation generated by the source, and to focus collected radiation to the downstream radiation beam emission aperture 60 of the chamber 3.

For example, the source SO may be configured to emit diverging radiation, and the collector 70 may be arranged to reflect that diverging radiation to provide a converging radiation beam, converging towards the emission aperture 60 (as in FIGS. 3 and 4). Particularly, the collector 70 may focus the radiation onto a focal point IF on an optical axis O of the system (see FIG. 2), which focal point IF is located in the emission aperture 60.

The emission aperture 60 may be a circular aperture, or have another shape (for example elliptical, square, or another shape). The emission aperture 60 is preferably small, for example having a diameter less than about 10 cm, preferably less than 1 cm, (measured in a direction transversally with a radiation transmission direction T, for example in a radial direction in case the aperture 60 has a circular cross-section). Preferably, the optical axis OX extends centrally through the aperture 60, however, this is not essential.

The radial fixation of an optical element 1 in a collector, such as collector 70 or collector 170 described above, may be performed by using an embodiment of a mount that includes a plurality of resilient members 2 as shown in FIGS. 5 and 6. The mount may be a so-called dual stage spring nest. The mount includes the plurality of resilient members 2 that at one end are subdivided into smaller resilient members 4', 4", 4"'. FIG. 5 depicts three resilient members 2 according to an embodiment, each of which includes three resilient subsection 4', 4", 4"' at one end thereof.

The optical element 1 may be a lens or a mirror. In an embodiment, the optical element 1 may be a collector mirror that is configured to condition radiation generated by an extreme ultraviolet radiation source, as described above.

As illustrated, each resilient member 2 may comprise a leaf spring having an elongated body having a length that is greater than its width, and a thickness that is less than its width. The elongated body may be plate-like in its configuration and substantially flat, or may be formed to have a curvature across its width that corresponds to the radius of the optical element 1 that it is configured to support. At least one end of the resilient member 2 may be subdivided into at least two subsections by any suitable method, such as machining, etching, etc. Although three subsections are illustrated, more or less subsections may be used. The illustrated embodiment is not intended to be limiting in any way. The resilient member 2 may be made out of any suitable material that has the desired properties for being in a high heat environment and exposed to extreme ultraviolet radiation.

The resilient members 2 are constructed and arranged to deliver the desired force/stiffness to the optical element 1 so that the optical element 1 may be mounted in the source module 3, more specifically, the collector 70, 170. The stiffness of the resilient member 2 may be selected to provide the desired force to the optical element 1 so that the optical element 1 may be held in a constant location, while handling effects of natural frequency and global deviations from normal, such as radial tolerancing and homogenous thermal expansion effects.

The resilient subsections 4', 4", 4"' are constructed and arranged to attend to local radial irregularities, inhomogenous thermal expansion, and Hertzian contact stress distribution. The desired dimensioning of the resilient subsections 4', 4", 4"' is determined by minimizing hysteresis effects. For example, the radial stiffness times the friction coefficient is desirably larger than the tangential stiffness.

Using a large amount of resilient members 2 may improve reproducibility of the lithographic process during operation, and may also decrease the sensitivity for irregularities along the optical element 1 that is held by the resilient members 2 that are included in the mount.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the term "including" does not exclude other elements or steps. Also, each of the terms "a" and "an" does not exclude a plurality. Any reference sign(s) in the claims shall not be construed as limiting the scope of the claims.

What is claimed is:

1. A mount configured to mount an optical element in a module for a lithographic apparatus, the mount comprising:
   a plurality of resilient members constructed and arranged to circumferentially support and exert a force on a perimeter of the optical element and attend to local radial irregularities, inhomogeneous thermal expansion, and Hertzian contact stress distribution,
   wherein each resilient member comprises a leaf spring having an elongated body having a length, a width and a thickness, the length being greater than the width and the thickness being less than the width, and a plurality of resilient subsections that are configured to engage the optical element around the perimeter thereof, each resilient subsection being configured to flex independent of another resilient subsection.

2. The mount according to claim 1, wherein the resilient subsections are arranged to allow for displacement with respect to each other.

3. The mount according to claim 1, wherein the resilient subsections are located at one end of the respective resilient member.

4. The mount according to claim 1, wherein the optical element is a mirror and wherein the mirror is a collector mirror constructed and arranged to condition radiation generated by an extreme ultraviolet radiation source.

5. A module for a lithographic apparatus, the module comprising
- a radiation source constructed and arranged to generate extreme ultraviolet radiation;
- a collector constructed and arranged to condition the extreme ultraviolet radiation; and
- a mount configured to mount an optical element in the collector, the mount comprising a plurality of resilient members constructed and arranged to circumferentially support and exert a force on a perimeter of the optical element and attend to local radial irregularities, inhomogeneous thermal expansion, and Hertzian contact stress distribution,
- wherein each resilient member comprises a leaf spring having an elongated body having a length, a width and a thickness, the length being greater than the width and the thickness being less than the width, and a plurality of resilient subsections that are configured to engage the optical element around a perimeter thereof, each resilient subsection being configured to flex independent of another resilient subsection.

6. The module according to claim 5, wherein the resilient subsections are arranged to allow for displacement with respect to each other.

7. The module according to claim 5, wherein the resilient subsections are located at one end of the respective resilient member.

8. The module according to claim 5, wherein the optical element is a mirror and wherein the mirror is a collector mirror constructed and arranged to condition radiation generated by an extreme ultraviolet radiation source.

9. A resilient member constructed and arranged to exert a force on a perimeter of an optical element of a module of a lithographic apparatus, the resilient member comprising a leaf spring having an elongated body having a length, a width and a thickness, the length being greater than the width and the thickness being less than the width, and a plurality of resilient subsections that are configured to engage the optical element around the perimeter thereof, attend to local radial irregularities, inhomogeneous thermal expansion, and Hertzian contact stress distribution, and flex independent of another resilient subsection.

10. The resilient member according to claim 9, wherein the resilient subsections are arranged to allow for displacement with respect to each other.

11. The resilient member according to claim 9, wherein the resilient subsections are located at one end of the resilient member.

12. The resilient member according to claim 9, wherein the optical element is a mirror and wherein the mirror is a collector mirror constructed and arranged to condition radiation generated by an extreme ultraviolet radiation source.

* * * * *